(12) United States Patent
Lai et al.

(10) Patent No.: US 12,027,753 B2
(45) Date of Patent: Jul. 2, 2024

(54) ELECTRONIC PACKAGE AND ANTENNA STRUCTURE THEREOF

(71) Applicant: SILICONWARE PRECISION INDUSTRIES CO., LTD., Taichung (TW)

(72) Inventors: Chia-Chu Lai, Taichung (TW); Ho-Chuan Lin, Taichung (TW); Min-Han Chuang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 481 days.

(21) Appl. No.: 17/360,843

(22) Filed: Jun. 28, 2021

(65) Prior Publication Data

US 2022/0359975 A1 Nov. 10, 2022

(30) Foreign Application Priority Data

May 4, 2021 (TW) .................................. 110116023

(51) Int. Cl.
| | |
|---|---|
| *H01Q 1/22* | (2006.01) |
| *H01L 23/66* | (2006.01) |
| *H01Q 1/24* | (2006.01) |
| *H01Q 1/38* | (2006.01) |
| *H01Q 1/48* | (2006.01) |

(52) U.S. Cl.
CPC ........... *H01Q 1/2283* (2013.01); *H01L 23/66* (2013.01); *H01Q 1/243* (2013.01); *H01Q 1/38* (2013.01); *H01Q 1/48* (2013.01); *H01L 2223/6616* (2013.01); *H01L 2223/6677* (2013.01)

(58) Field of Classification Search
CPC ..... H01L 2223/6616; H01L 2223/6677; H01L 2224/131; H01L 2224/13147; H01L 2224/16227; H01L 2224/16235; H01L 2224/48227; H01L 23/49816; H01L 23/49822; H01L 23/49827; H01L 23/552; H01L 23/66; H01L 24/13; H01L 24/16; H01L 24/48; H01L 2924/00014; H01L 2924/014; H01L 2924/15321; H01L 2924/3025; H01Q 1/2283; H01Q 1/243; H01Q 1/38; H01Q 1/48; H01Q 9/285
See application file for complete search history.

(56) References Cited

U.S. PATENT DOCUMENTS

| | | | |
|---|---|---|---|
| 10,157,834 B1* | 12/2018 | Tang | ................. H01L 23/53233 |
| 2002/0084963 A1* | 7/2002 | Komiya | ............... G09G 3/3688 |
| | | | 345/87 |
| 2019/0209391 A1* | 7/2019 | Heil | ......................... A61F 13/42 |
| 2020/0058606 A1* | 2/2020 | Tsai | ...................... H01L 23/481 |
| 2020/0295453 A1* | 9/2020 | Kuo | .................... H01L 23/3128 |

(Continued)

*Primary Examiner* — Thien M Le
(74) *Attorney, Agent, or Firm* — Kelly & Kelley, PLLC

(57) ABSTRACT

An electronic package is provided, in which a ground layer is arranged on one side of an insulator, and a first antenna portion and a second antenna portion embedded in the insulator are vertically disposed on the ground layer, where a gap is formed between the first antenna portion and the second antenna portion, such that the first antenna portion and the second antenna portion are electrically matched with each other, and the ground layer is electrically connected to the second antenna portion but free from being electrically connected to the first antenna portion.

20 Claims, 4 Drawing Sheets

(56) References Cited

U.S. PATENT DOCUMENTS

2022/0230973 A1\* 7/2022 Wei .................. H01L 24/83
2022/0271414 A1\* 8/2022 Liao .................. H01Q 1/48
2022/0359975 A1\* 11/2022 Lai ................... H01Q 9/285

\* cited by examiner

ELECTRONIC PACKAGE AND ANTENNA STRUCTURE THEREOF

BACKGROUND

1. Technical Field

The present disclosure relates to a semiconductor packaging process, and more particularly, to an electronic package with an antenna structure.

2. Description of Related Art

Wireless communication technology has now been widely used in a myriad of consumer electronic products (e.g., mobile phones, tablets, etc.) to enable the reception and/or transmission of various kinds of wireless signals. In order to satisfy the demands for portability and networking of the consumer electronic products, manufacturing and designs of wireless communication modules are developed with compactness and lightweight in mind. Among which, patch antennae are often used in the wireless communication modules of electronic products owing to their small sizes, light weight and ease of manufacturing.

Technologies related to the applications of 5G will be fully commercialized in the future. Its application frequency will be in the high-frequency band in the range from approximately 1 GHz to 1000 GHz, and its commercial application model will be 5G in cooperation with 4G LTE where an outdoor cellular base station can be used in cooperation with smaller indoor base stations. As such, a 5G mobile communication will utilize a large amount of antennae in a base station for the large and fast transmissions and low latency of a 5G system.

FIG. 1 is a schematic perspective view of a conventional wireless communication module. As shown in FIG. 1, the wireless communication module 1 includes: a substrate 10, a plurality of electronic components 11 provided on the substrate 10, an antenna structure 12, and an encapsulant 13. The substrate 10 is a circuit board. The electronic components 11 are disposed on the substrate 10 and electrically connected with substrate 10. The antenna structure 12 is a patch antenna with an antenna body 120 and a feed line 121. The antenna body 120 is electrically connected with an electronic component 11 via the feed line 121. The encapsulant 13 encapsulates the electronic components 11 and a portion of the feed line 121. On the other hand, in the 5G system, facing the demands for higher signal quality and transmission speed, more antennae need to be provided to improve the quality of signals and the transmission speed.

However, in the conventional wireless communication module 1, the antenna structure 12 is a patch antenna, and the dimensions (i.e., length and width) of the substrate 10 are fixed. It is difficult to reduce the volume of the substrate 10. Moreover, the radiation direction of the antenna structure 12 is constrained, which limits the functionality of the antenna structure 12. If it is operated in cooperation with 5G antennae, the signals emitted may have poor efficiencies. As a result, it would be difficult for the wireless communication module 1 to meet the operating demands of the 5G antennae.

Therefore, there is a need for a solution that addresses the aforementioned issues of the prior art.

SUMMARY

In view of the aforementioned shortcomings of the prior art, the present disclosure provides an antenna structure, which includes: an insulator having two opposite sides; a first antenna portion including at least one pillar-shaped antenna body embedded in the insulator and at least one acting circuit disposed on a surface of the insulator and connected with the antenna body, wherein the antenna body extends from one side of the insulator to the other side of the insulator, such that the antenna body interconnects the two opposite sides of the insulator; a second antenna portion including at least one conductive pillar embedded in the insulator and at least one auxiliary circuit disposed on the surface of the insulator and connected with the conductive pillar, wherein the conductive pillar is arranged correspondingly to the antenna body, wherein the conductive pillar extends from one side of the insulator to the other side of the insulator, such that the conductive pillar interconnects the two opposite sides of the insulator, and wherein a gap is formed between the antenna body and the conductive pillar, and the first antenna portion and the second antenna portion are electrically matched with each other; and a ground layer arranged on one of the sides of the insulator and electrically connected to the second antenna portion, wherein the ground layer is free from being electrically connected to the first antenna portion.

In the aforementioned antenna structure, the present disclosure further comprises a plurality of conductors arranged around the antenna body in the insulator.

In the aforementioned antenna structure, a plurality of the ground layers separated from each other are arranged in the insulator.

In the aforementioned antenna structure, the first antenna portion and/or the second antenna portion is located within a vertically projected area of the ground layer.

In the aforementioned antenna structure, a vertically projected area of the ground layer is greater than a vertically projected area of the first antenna portion and/or a vertically projected area of the second antenna portion.

In the aforementioned antenna structure, the present disclosure further comprises an opening region formed in the ground layer, wherein the antenna body passes through the opening region without contacting the ground layer.

In the aforementioned antenna structure, one end of the antenna body is used as a signal source, and the other end of the antenna body is exposed from the insulator and used as an emitting source. For example, the acting circuit extends horizontally on the insulator from the other end of the antenna body exposed from the insulator.

In the aforementioned antenna structure, one end of the conductive pillar is connected to the ground layer, and the other end of the conductive pillar is exposed from the insulator. For example, the auxiliary circuit extends horizontally on the insulator from the other end of the conductive pillar exposed from the insulator.

In the aforementioned antenna structure, the auxiliary circuit and the acting circuit are separated from each other.

In the aforementioned antenna structure, the auxiliary circuit and the acting circuit are aligned with each other and arranged on an imaginary straight line.

In the aforementioned antenna structure, the second antenna portion is used for grounding, such that the first antenna portion and the second antenna portion constitute a dipole antenna.

In the aforementioned antenna structure, the conductive pillar is arranged in parallel with the antenna body.

The present disclosure further provides an electronic package, which includes: the aforementioned antenna structure; and an electronic component communicatively connected with the first antenna portion and the second antenna portion, wherein the electronic component is carried by the insulator.

In the aforementioned electronic package, the insulator is arranged with a circuit structure electrically connected with the electronic component, the first antenna portion and the second antenna portion.

The aforementioned electronic package further includes a ground portion bonded with the insulator. For example, the ground portion is a conductive structure embedded in the insulator. Furthermore, the insulator is arranged with a circuit structure electrically connected with the electronic component, and the circuit structure is electrically connected with the ground portion. Alternatively, the ground portion includes a plurality of conductive layers and a plurality of conductive blind vias electrically connected with the plurality of conductive layers and the ground layer, and wherein portions of the conductive layers are exposed from the insulator to be used as external connection pads.

As can be understood from the above, in the electronic package of the present disclosure and the antenna structure thereof, by vertically arranging the first antenna portion above the ground layer and not allowing the distribution areas of the first and second antenna portions to be greater than the layout area of the ground layers, compared to the prior art, the antenna structure of the present disclosure can effectively reduce the layout area of the antenna to facilitate reduction of the layout area of the insulator, while increasing the flexibility in antenna arrangement.

Moreover, since the distribution areas of the first and second antenna portions are free from being greater than the layout area of the ground layers, the radiation direction of the end of the antenna body exposed from the insulator can be perpendicular to the acting circuit or the surface of the insulator, and the radiation direction of the antenna structure is therefore not constrained and the functionality of the antenna structure can be enhanced. Thus, compared to the prior art, when the antenna structure is applied to antenna operations in a system, efficiency of signal emissions can be improved, thereby facilitating the electronic package in meeting the requirements of the antenna operations in the system.

DETAILED DESCRIPTION OF THE EMBODIMENTS

Figure 1:
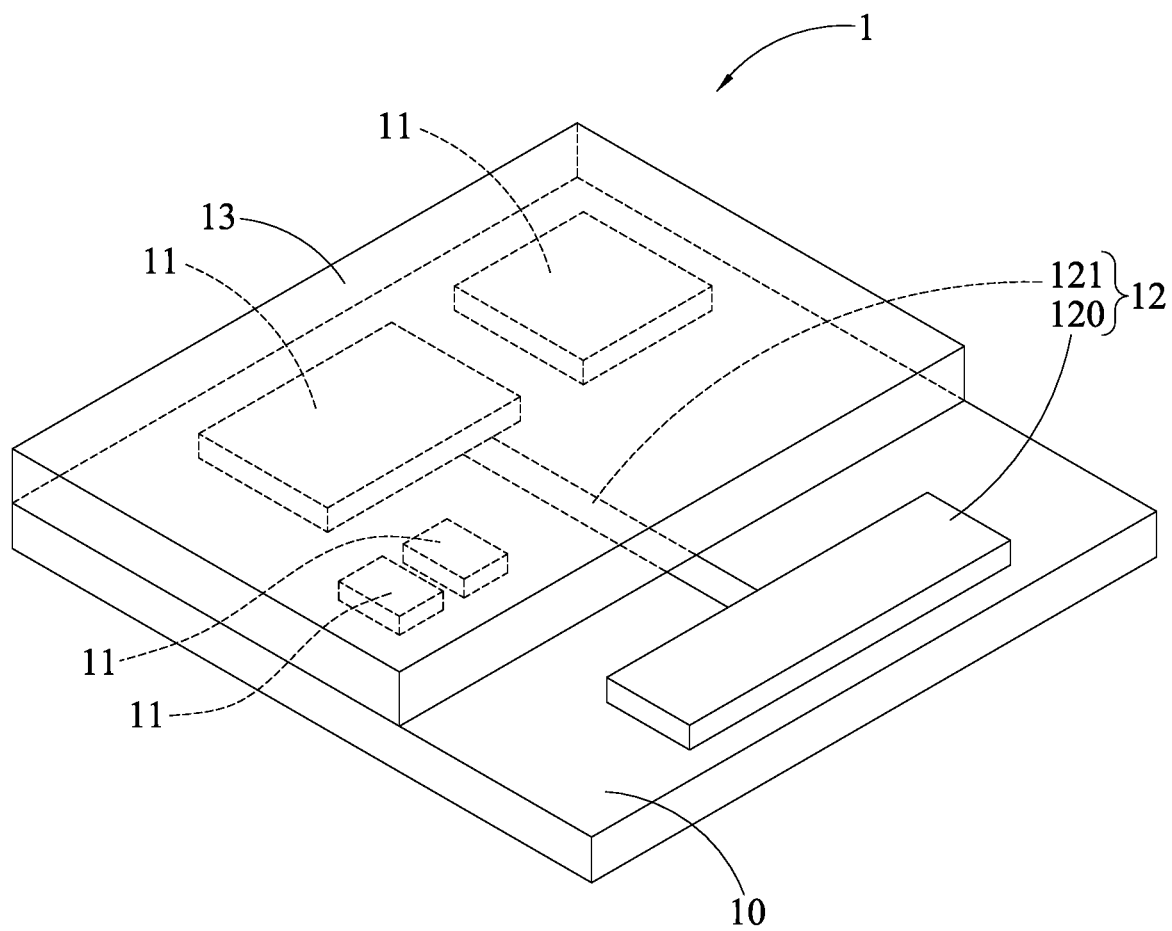
FIG. 1 is a schematic perspective view of a conventional wireless communication module.

The implementations of present disclosure are illustrated using the following specific embodiments. One of ordinary skill in the art can readily appreciate other advantages and technical effects of the present disclosure upon reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and the objectives achieved by the present disclosure, any modifications, changes or adjustments to the structures, ratio relationships or sizes, are to be construed as falling within the range covered by the technical contents disclosed herein. Meanwhile, terms such as "above," "first," "second," "a," "an," and the like, are for illustrative purposes, and are not meant to limit the scope in which the present disclosure can be implemented. Any variations or modifications made to their relative relationships, without changing the substantial technical content, are also to be considered as within the scope in which the present disclosure can be implemented.

Figure 2A:
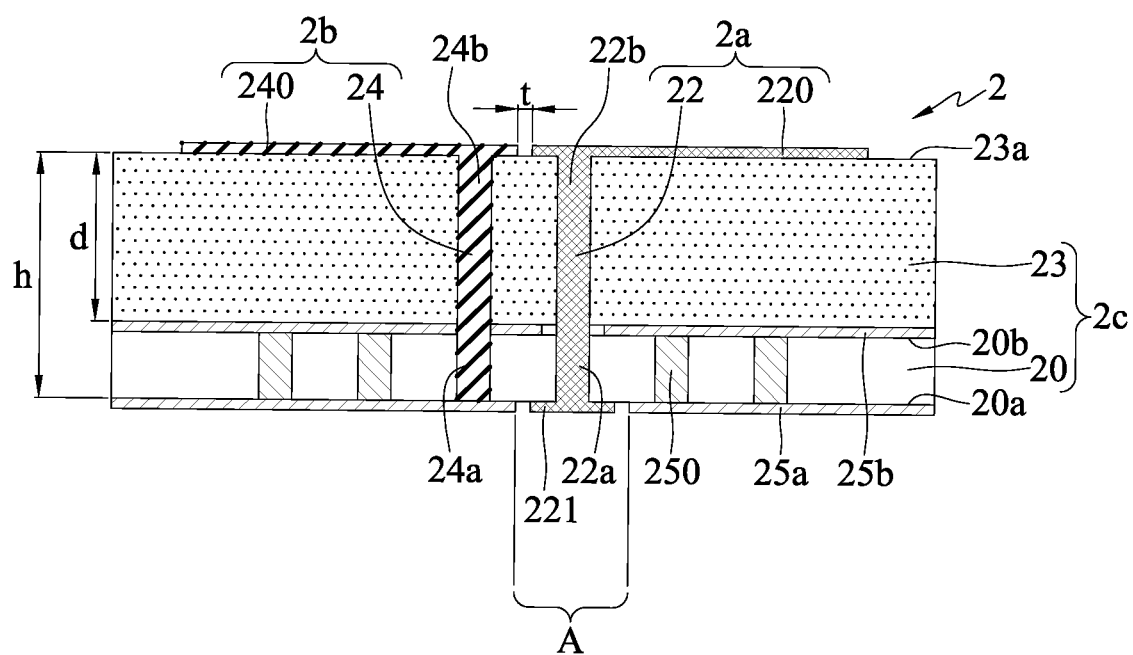
FIG. 2A is a schematic cross-sectional view of an antenna structure in accordance with the present disclosure.
Figure 2B:
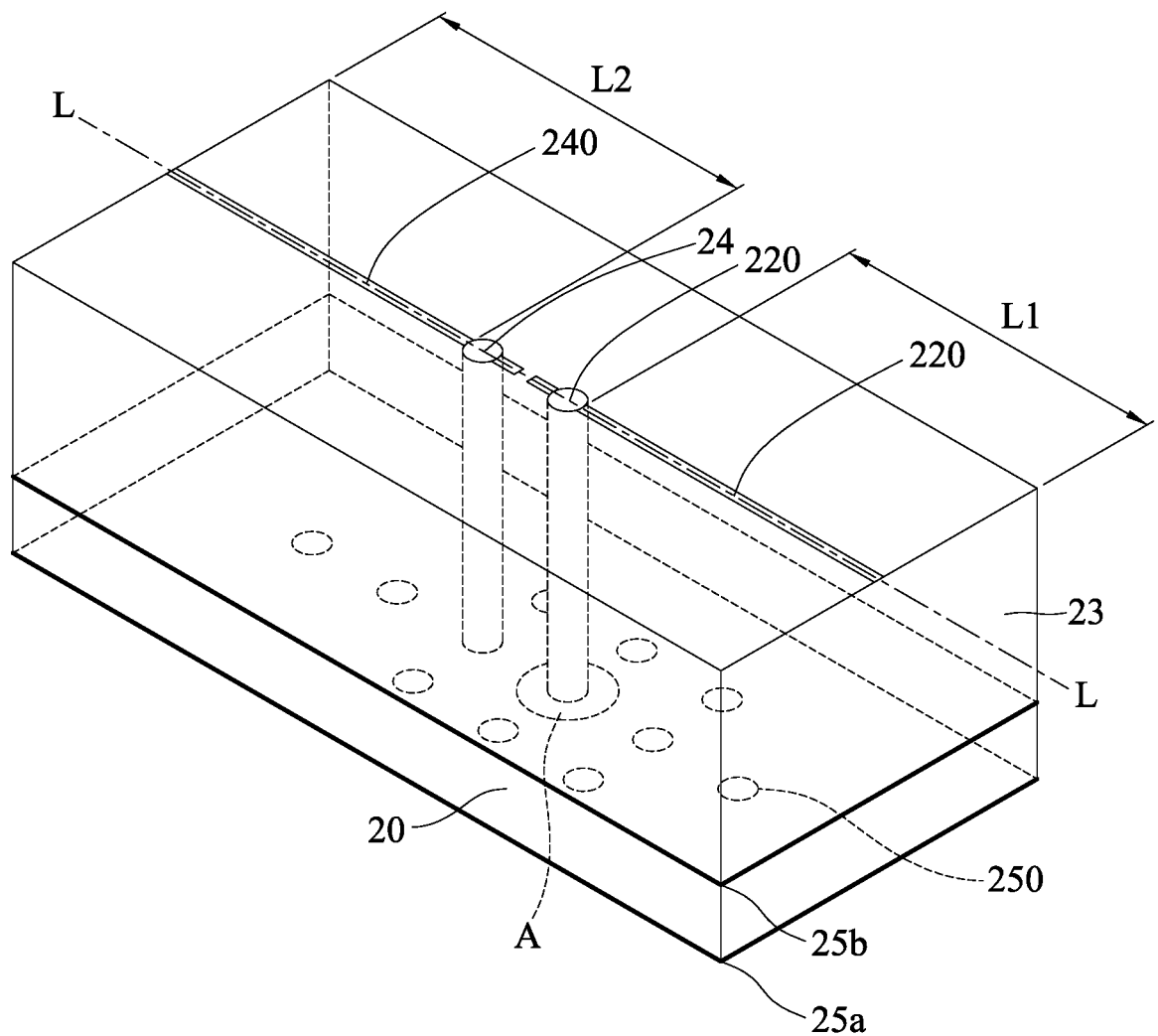
FIG. 2B is a schematic perspective view of an antenna structure in accordance with the present disclosure.

FIGS. 2A and 2B are schematic views depicting an antenna structure 2 in accordance with the present disclosure. In an embodiment, the antenna structure 2 is in the form of a dipole antenna.

As shown in FIG. 2A, the antenna structure 2 includes: an insulator 2c and a first antenna portion 2a and a second antenna portion 2b bonded to the insulator 2c.

The insulator 2c includes a base 20 and an insulating layer 23 disposed on the base 20. The base 20 has a first surface 20a and a second surface 20b opposite to each other, such that the insulating layer 23 is formed on the second surface 20b of the base 20.

In an embodiment, the base 20 includes, for example, a dielectric material, polyimide (PI), a dry film, an epoxy resin, a molding compound, or the like, and the present disclosure is not limited to the above.

Furthermore, at least one ground layer 25a, 25b is provided on the base 20. For example, a plurality of ground layers 25a, 25b that are separated from one another are arranged on the first surface 20a and the second surface 20b of the base 20, respectively. The ground layers 25a, 25b are connected through a plurality of conductors 250 (e.g., conductive blind vias). More specifically, the ground layers 25a, 25b are formed by coating a metal layer (e.g., a copper material), such as by sputtering, vapor deposition, electroplating or chemical plating, or by lamination or foiling (e.g., metal foil with mesh or any arbitrary patterns).

Furthermore, the insulating layer 23 includes, for example, a dielectric material, polyimide (PI), a dry film, an epoxy resin, a molding compound, or the like, and the present disclosure is not limited to the above. It can be understood that the base 20 and the insulating layer 23 can be formed of the same material or different materials depending on the needs.

The first antenna portion 2a includes an antenna body 22 embedded in the insulator 2c. The antenna body 22 is in the form of a conductive pillar and extends from one side to the other side of the insulator 2c, such that the antenna body 22 interconnects the two opposite sides of the insulator 2c, and that one end 22a of the antenna body 22 is located in the base 20 to be used as a signal source, while the other end 22b of the antenna body 22 is exposed from the insulator 2c to be used as an emitting source.

In an embodiment, one end 22a of the antenna body 22 interconnects the first surface 20a and the second surface 20b of the base 20, and the antenna body 22 penetrates through the insulating layer 23, so that the other end 22b of the antenna body 22 is exposed from a surface 23a of the insulating layer 23. In one example, a pad 221 of the antenna body 22 can be formed on the first surface 20a of the base 20. Opening regions A are formed in the ground layers 25a, 25b, so that the antenna body 22 penetrates through the opening regions A and is free from being in contact with the ground layers 25a, 25b, and that the pad 221 is positioned in the opening regions A without contacting the ground layers 25a, 25b.

Moreover, the first antenna portion 2a further includes an acting circuit 220 connected with the antenna body 22. The acting circuit 220 is arranged on the surface 23a of the insulating layer 23 and extends horizontally from the end 22b of the antenna body 22 exposed from the insulating layer 23. The length L1 of the acting circuit 220 can be adjusted (as shown in FIG. 2B) to change the wavelength (or the frequency) of signals emitted by the antenna body 22. In other words, the length L1 of the acting circuit 220 is proportional to the radiation wavelength.

In addition, the length of the acting circuit 220 and the height of the antenna body 22 in the insulating layer 23 (equivalent to the thickness d of the insulating layer 23) can be adjusted to change the impedance value of the antenna body 22.

Moreover, the first antenna portion 2a can be formed by applying a metal layer (e.g., a copper material), such as by sputtering, vapor deposition, electroplating or chemical plating, or by lamination or framing.

The second antenna portion 2b includes a conductive pillar 24 embedded in the insulator 2c. The conductive pillar 24 extends from one side to the other side of the insulator 2c, such that the conductive pillar 24 interconnects the two opposite sides of the insulator 2c, and that one end 24a of the conductive pillar 24 interconnects the ground layers 25a, 25b, while the other end 24b of the conductive pillar 24 is exposed from the insulator 2c.

In an embodiment, the conductive pillar 24 is arranged in parallel with the antenna body 22, and a gap t is formed between the antenna body 22 and the conductive pillar 24. The first antenna portion 2a and the second antenna portion 2b are symmetrically arranged, and the first antenna portion 2a and the second antenna portion 2b are electrically matched with each other. For example, the second antenna portion 2b can be used as a ground, and the first antenna portion 2a and the second antenna portion 2b form a dipole antenna.

Moreover, the second antenna portion 2b further includes an auxiliary circuit 240 connected with the conductive pillar 24. The auxiliary circuit 240 is arranged on the surface 23a of the insulating layer 23 and extends horizontally from the end 24b of the conductive pillar 24 exposed from the insulating layer 23. The length L2 of the auxiliary circuit 240 (as shown in FIG. 2B) can be adjusted in cooperation with the acting circuit 220, so the antenna body 22 can emit signals of the required waveform. In one example, the auxiliary circuit 240 and the acting circuit 220 are separated from each other by a distance (gap t), and the auxiliary circuit 240 and the acting circuit 220 are aligned with each other and arranged on an imaginary straight line L, as shown in FIG. 2B.

Furthermore, the ground layers 25a, 25b can be selected to cover a vertically projected area of surface area of the base 20, for example, the entire surface shown in FIG. 2B, so that this vertically projected area is greater than the vertically projected area of the first antenna portion 2a and/or the vertically projected area of the second antenna portion 2b. For example, the first antenna portion 2a and/or the second antenna portion 2b are within the vertically projected area of the ground layers 25a, 25b.

Moreover, the second antenna portion 2b can be formed by applying a metal layer (e.g., a copper material), such as by sputtering, vapor deposition, electroplating or chemical plating, or the conductive pillar 24 can be formed by lamination or framing.

It can be understood that a patterning (e.g., electroplating or etching of metals) routing process, such as a redistribution layer (RDL) process, can be performed on the base 20 and/or the insulating layer 23 to manufacture the first antenna portion 2a and the second antenna portion 2b simultaneously.

Therefore, the antenna structure 2 of the present disclosure allows the first antenna portion 2a to be vertically disposed above the ground layers 25a, 25b, such that the radiation direction of the exposed end 22b of the antenna body 22 is perpendicular to the acting circuit 220 or the first surface 20a of the base 20 (or along the direction of the pillar of the antenna body 22), and the distribution areas (or vertically projected areas) of the first antenna portion 2a and the second antenna portion 2b are not greater than the layout areas (or vertically projected areas) of the ground layers 25a, 25b. Thus, compared to the prior art, the antenna structure 2 of the present disclosure can effectively reduce the layout area of the antenna to facilitate reduction of the layout area of the insulator 2c (or the first surface 20a of the base 20), while increasing flexibility in antenna arrangement.

In addition, since the distribution area (or vertically projected area) of the first antenna portion 2a (or the auxiliary circuit 240) is not greater than the layout area (or vertically projected area) of the ground layer 25a, the ground layer 25a can be used as a reflector to effectively reflect signals from the acting circuit 220, so that the radiation direction of the exposed end 22b of the antenna body 22 can be perpendicular to the acting circuit 220 or the first surface 20a of the base 20 (or along the direction of the pillar of the antenna body 22). As such, the radiation direction of the antenna structure 2 is not constrained and the functionality of the antenna structure 2 can be enhanced.

Furthermore, a plurality of conductors 250 for grounding are provided around the signal source (the end 22a of the antenna body 22 at the base 20 or the pad 221) of the antenna body 22, that is, the conductors 250 are arranged around the antenna body 22 in order to shield the signal source. This reduces signal distortions or losses of the antenna body 22.

Figure 3A:
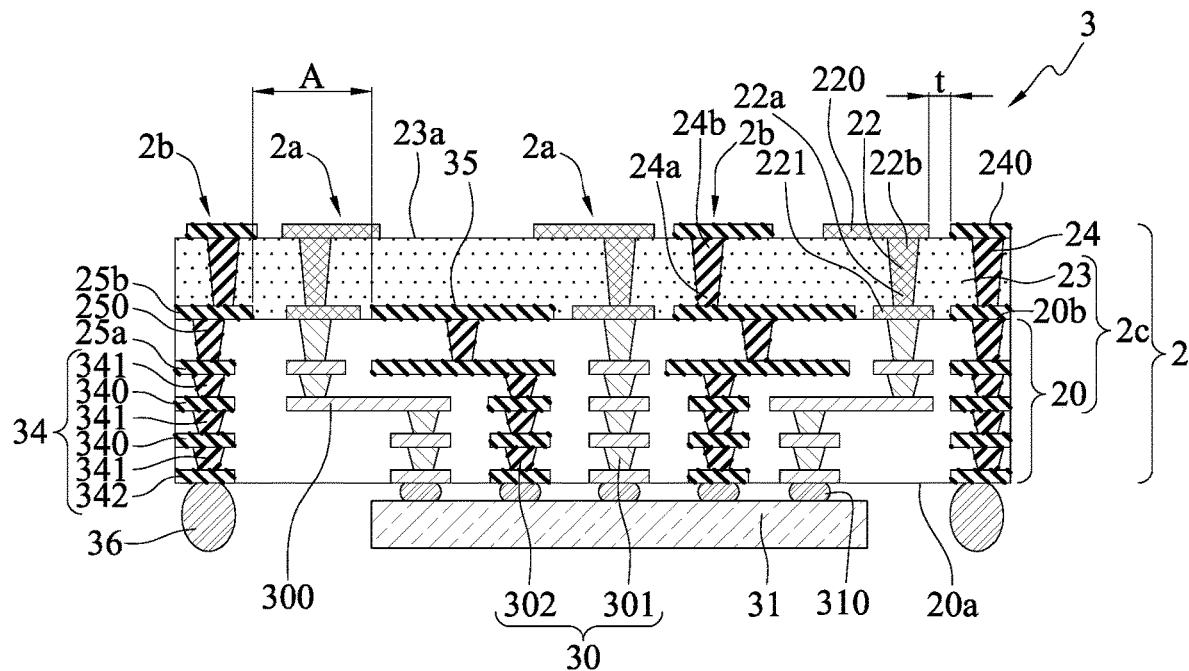
FIG. 3A is a schematic cross-sectional view of an electronic package in accordance with the present disclosure.

FIG. 3A is a schematic cross-sectional view of an electronic package 3 in accordance with the present disclosure. As shown in FIG. 3A, the electronic package 3 includes an antenna structure 2 and at least one electronic component 31 communicatively connected with the first antenna portion 2a and the second antenna portion 2b.

In an embodiment, the electronic package 3 further includes a ground portion 34 arranged on the insulator 2c, and the electronic component 31 is carried by the insulator 2c.

A circuit structure 30 is provided in the base 20 of the insulator 2c to form a package substrate with a core layer and circuit layers or a coreless circuit structure with multiple circuit layers. The circuit structure 30 includes at least one first circuit layer 301 and at least one second circuit layer 302 formed in the base 20, such as fan-out redistribution layers (RDLs).

In an embodiment, ground layer 25b is disposed on the second surface 20b of the base 20, whereas the other ground layer 25a is disposed in the base 20. The ground layers 25a, 25b are separated from each other and interconnected via at least one conductor 250.

The insulating layer 23 of the insulator 2c is bonded onto the second surface 20b of the base 20, and the material forming the insulating layer 23 can be, for example, PI, a dry film, a molding compound, etc., and the present disclosure is not limited to the above.

The electronic component 31 is disposed on the base 20, either on the first surface 20a or on the second surface 20b, or on both the first surface 20a and the second surface 20b as needed, and can be embedded in the base 20 and/or the insulating layer 23.

In an embodiment, the electronic component 31 is an active component, a passive component, or a combination of both. The active component can be, for example, a semiconductor chip, and the passive component can be, for example, a resistor, a capacitor or an inductor. For example, the electronic component 31 can be a semiconductor chip with mmWave functionality, and can be disposed on the first circuit layer 301 and the second circuit layer 302 by the flip-chip technique through a plurality of conductive bumps 310 (e.g., solder or copper material) and electrically connected with the first circuit layer 301 and the second circuit layer 302. Alternatively, the electronic component 31 can be electrically connected with the first circuit layer 301 and the second circuit layer 302 by wire bonding through a plurality of bonding wires (not shown). Alternatively, the electronic component 31 can be in direct contact with the first circuit layer 301 and the second circuit layer 302. However, the method by which the electronic component 31 is electrically connected with the circuit layers is not limited to those described above.

Therefore, by manufacturing the base 20 and the circuit structure 30 using a carrier board for packaging processes to carry the electronic component 31, the electronic component 31 can be communicatively connected with the first antenna portion 2a and the second antenna portion 2b via the first circuit layer 301 and the second circuit layer 302.

The first antenna portion 2a is disposed on the base 20 and bonded with the insulating layer 23, and is electrically connected with the electronic component 31 via the first circuit layer 301.

In an embodiment, the first antenna portion 2a is free from being embedded in the base 20, the antenna body 22 is vertically arranged on the second surface 20b of the base 20 and embedded in the insulating layer 23. One end 22a of the antenna body 22 is bonded with the second surface 20b of the base 20 and electrically connected with the first circuit layer 301, whereas the other end 22b of the antenna body 22 is exposed from the insulating layer 23 to be used as an emitting source. For example, one end 22a of the antenna body 22 can be bonded onto the second surface 20b of the base 20 and electrically connected with the first circuit layer 301 via the pad 221. The opening regions A are formed in the ground layers 25a, 25b to allow the pad 221 and the first circuit layer 301 to pass through the opening regions A without contacting the ground layers 25a, 25b.

Moreover, the acting circuit 220 of the first antenna portion 2a extends horizontally from the exposed end 22b of the antenna body 22 on the surface 23a of the insulating layer 23.

The second antenna portion 2b is also vertically arranged on the base 20 and bonded with the insulating layer 23, and is electrically connected with the electronic component 31 through the second circuit layer 302.

Figure 3B:
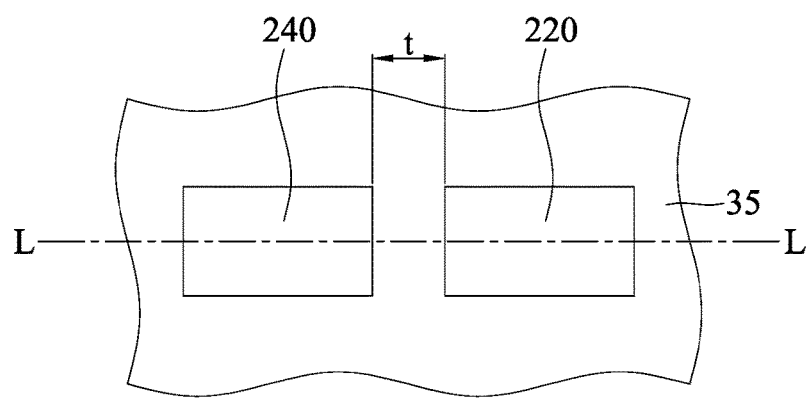
FIG. 3B is a schematic partial top view of FIG. 3A.

In an embodiment, the conductive pillar 24 of the second antenna portion 2b is spaced apart from the antenna body 22 by a gap t, such that the first antenna portion 2a and the second antenna portion 2b are electrically matched with each other to form a dipole antenna. The auxiliary circuit 240 of the second antenna portion 2b extends horizontally from the exposed end 24b of the conductive pillar 24 on the surface 23a of the insulating layer 23. For example, the auxiliary circuit 240 and the acting circuit 220 are separated from each other by a distance (gap t), and the auxiliary circuit 240 and the acting circuit 220 are aligned with each other and arranged on an imaginary straight line L, as shown in FIG. 3B.

The ground portion 34 is a conductive structure embedded in the base 20, and thus can be manufactured with the second circuit layer 302. In one example, the ground portion 34 includes a plurality of conductive layers 340 electrically connected with the second circuit layer 302 and a plurality of conductive blind vias 341 electrically connected with the conductive layers 340 and the ground layer 25a. Some of the conductive layers 340 can be exposed from the first surface 20a of the base 20 to be used as external connection pads 342.

In addition, the electronic package 3 further includes a plurality of conductive components 36 disposed on the first surface 20a of the base 20. In one example, the conductive components 36 are solder balls disposed on the external connection pads 342 for electrically connected with the second circuit layer 302 and/or the first circuit layer 301.

Therefore, the electronic package 3 in accordance with the present disclosure utilizes the design of the antenna structure 2, allowing the electronic package 3 to have effectively reduced antenna layout area, which reduces the area of the carrier board used for packaging process, and increases the flexibility in antenna arrangement.

Moreover, the radiation direction of the antenna structure 2 is not constrained and is advantageous in improving the functionality of the antenna structure 2. As a result, when the antenna structure 2 is applied to antenna operations in a 5G system, efficiency of signal emission can be improved, thereby facilitating the electronic package 3 in meeting the requirements of the antenna operations in the 5G system.

Furthermore, using the ground layers 25a, 25b, the electronic package 3 is capable of preventing cross talk, noise interference and radiation interference from the antenna body 22 to the electronic component 31.

In summary, in the electronic package of the present disclosure and the antenna structure thereof, by vertically arranging the first antenna portion above the ground layer and not allowing the distribution areas of the first and second antenna portions to be greater than the layout area of the ground layers, the antenna structure of the present disclosure can effectively reduce the layout area of the antenna to facilitate the reduction of layout area of the insulator, while increasing the flexibility in antenna arrangement.

Moreover, since the radiation direction of the end of the antenna body exposed from the insulator can be perpendicular to the acting circuit or a surface of the insulator, the radiation direction of the antenna structure is not constrained and the functionality of the antenna structure can be enhanced. Thus, when the antenna structure is applied to antenna operations in a system, efficiency of signal emissions can be improved, thereby facilitating the electronic package in meeting the requirements of the antenna operations in the system.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An antenna structure, comprising:
   an insulator having two opposite sides;
   a first antenna portion including at least one antenna body of pillar shape embedded in the insulator and at least one acting circuit disposed on a surface of the insulator and connected with the antenna body, wherein the antenna body of the first antenna portion including the acting circuit extends from one side of the insulator to the other side of the insulator, such that the antenna body of the first antenna portion including the acting circuit interconnects the two opposite sides of the insulator;
   a second antenna portion including at least one conductive pillar embedded in the insulator and at least one auxiliary circuit disposed on the surface of the insulator and connected with the conductive pillar, wherein the conductive pillar of the second antenna portion including the auxillary circuit is arranged correspondingly to the antenna body of the first antenna portion including the acting circuit, wherein the conductive pillar extends from one side of the insulator to the other side of the insulator, such that the conductive pillar of the second antenna portion including the auxillary circuit interconnects the two opposite sides of the insulator, and wherein a gap is formed between the antenna body of the first antenna portion including the acting circuit and the conductive pillar of the second antenna portion including the auxillary circuit, and the first antenna portion including the antenna body and the acting circuit and the second antenna portion including the conductive pillar and the auxillary circuit are electrically matched with each other; and
   a ground layer arranged on one of the two opposite sides of the insulator and electrically connected to the second antenna portion including the conductive pillar and the auxillary circuit, wherein the ground layer is free from being electrically connected to the first antenna portion including the antenna body and the acting circuit.

2. The antenna structure of claim 1, further comprising a plurality of conductors arranged around the antenna body in the insulator.

3. The antenna structure of claim 1, wherein a plurality of the ground layers separated from each other are arranged in the insulator.

4. The antenna structure of claim 1, wherein at least one of the first antenna portion and the second antenna portion is located within a vertically projected area of the ground layer.

5. The antenna structure of claim 1, wherein a vertically projected area of the ground layer is greater than at least one of a vertically projected area of the first antenna portion and a vertically projected area of the second antenna portion.

6. The antenna structure of claim 1, further comprising an opening region formed in the ground layer, wherein the antenna body passes through the opening region without contacting the ground layer.

7. The antenna structure of claim 1, wherein one end of the antenna body is used as a signal source, and the other end of the antenna body is exposed from the insulator and used as an emitting source.

8. The antenna structure of claim 7, wherein the acting circuit extends horizontally on the insulator from the other end of the antenna body exposed from the insulator.

9. The antenna structure of claim 1, wherein one end of the conductive pillar is connected to the ground layer, and the other end of the conductive pillar is exposed from the insulator.

10. The antenna structure of claim 9, wherein the auxiliary circuit extends horizontally on the insulator from the other end of the conductive pillar exposed from the insulator.

11. The antenna structure of claim 1, wherein the auxiliary circuit and the acting circuit are separated from each other.

12. The antenna structure of claim 1, wherein the auxiliary circuit and the acting circuit are aligned with each other and arranged on an imaginary straight line.

13. The antenna structure of claim 1, wherein the second antenna portion is used for grounding, such that the first antenna portion and the second antenna portion constitute a dipole antenna.

14. The antenna structure of claim 1, wherein the conductive pillar is arranged in parallel with the antenna body.

15. An electronic package, comprising:
    the antenna structure of claim 1; and
    an electronic component communicatively connected with the first antenna portion and the second antenna portion, wherein the electronic component is carried by the insulator.

16. The electronic package of claim 15, wherein the insulator is arranged with a circuit structure electrically connected with the electronic component, the first antenna portion and the second antenna portion.

17. The electronic package of claim 15, further comprising a ground portion bonded with the insulator.

18. The electronic package of claim 17, wherein the ground portion is a conductive structure embedded in the insulator.

19. The electronic package of claim 18, wherein the insulator is arranged with a circuit structure electrically connected with the electronic component, and the circuit structure is electrically connected with the ground portion.

20. The electronic package of claim 17, wherein the ground portion includes a plurality of conductive layers and a plurality of conductive blind vias electrically connected with the plurality of conductive layers and the ground layer, and wherein portions of the conductive layers are exposed from the insulator to be used as external connection pads.

* * * * *